United States Patent
Bun et al.

(10) Patent No.: US 6,963,789 B2
(45) Date of Patent: Nov. 8, 2005

(54) SUBSTRATE PROCESSING APPARATUS CONTROL SYSTEM AND SUBSTRATE PROCESSING APPARATUS

(75) Inventors: Tamihiro Bun, Kyoto (JP); Kinya Murata, Kyoto (JP); Kenji Hashinoki, Kyoto (JP); Kenji Kamei, Kyoto (JP); Noriaki Yokono, Kyoto (JP); Kenji Sugimoto, Kyoto (JP); Tsuyoshi Mitsuhashi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 10/253,010

(22) Filed: Sep. 23, 2002

(65) Prior Publication Data

US 2003/0060917 A1 Mar. 27, 2003

(30) Foreign Application Priority Data

Sep. 25, 2001 (JP) .................................... 2001-291227
Sep. 26, 2001 (JP) .................................... 2001-294185

(51) Int. Cl.$^7$ ............................................ G06F 19/00
(52) U.S. Cl. ...................................... 700/121; 700/110
(58) Field of Search ............................... 700/108, 109, 700/110, 121; 427/8–10

(56) References Cited

U.S. PATENT DOCUMENTS

| | | | | |
|---|---|---|---|---|
| 4,977,330 A | * | 12/1990 | Batchelder et al. | ..... 250/559.27 |
| 5,393,624 A | | 2/1995 | Ushihima | |
| 5,747,201 A | * | 5/1998 | Nakayama et al. | ........... 430/30 |
| 5,939,130 A | | 8/1999 | Shiraishi et al. | |
| 6,004,047 A | * | 12/1999 | Akimoto et al. | ............ 396/604 |
| 6,161,054 A | * | 12/2000 | Rosenthal et al. | .......... 700/121 |
| 6,221,787 B1 | * | 4/2001 | Ogata | ......................... 438/758 |
| 6,576,385 B2 | * | 6/2003 | Bode et al. | .................... 430/30 |
| 6,587,744 B1 | * | 7/2003 | Stoddard et al. | ............ 700/121 |
| 2003/0017256 A1 | * | 1/2003 | Shimane | ........................ 427/9 |

FOREIGN PATENT DOCUMENTS

| | | |
|---|---|---|
| JP | 10-43666 | 2/1998 |
| JP | 449802 | 8/2001 |

OTHER PUBLICATIONS

English–language translation of Taiwanese Office Action mailed Feb. 4, 2004.
Untranslated letter from Korean Associate enclosing Office Action issued by Korean Patent Office on Nov. 23, 2004 in connection with corresponding application No. 10–2002–0056764.
Korean and Japanese language versions of Korean Office Action dated Nov. 23, 2004 issued in connection with corresponding application No. 10–2002–0056764.

* cited by examiner

*Primary Examiner*—Leo Picard
*Assistant Examiner*—Ryan A. Jarrett
(74) *Attorney, Agent, or Firm*—Ostrolenk, Faber, Gerb & Soffen, LLP

(57) ABSTRACT

A controller is connected to a substrate processing apparatus and an exposure apparatus. A pilot substrate subjected to a series of processing as preprocessing is transported to an inspection unit. An inspection result determination part compares inspection results received from the inspection unit with substrate condition data so that a condition change instruction part changes the processing condition of each processing unit when no requirement is satisfied. This operation is so repeated that a processing control part executes actual processing according to recipe data when the inspection results satisfy the requirement. Thus, the efficiency a step of changing the processing condition of each processing part in response to the inspection results in the inspection part is improved in preprocessing executed in the substrate processing apparatus.

12 Claims, 13 Drawing Sheets

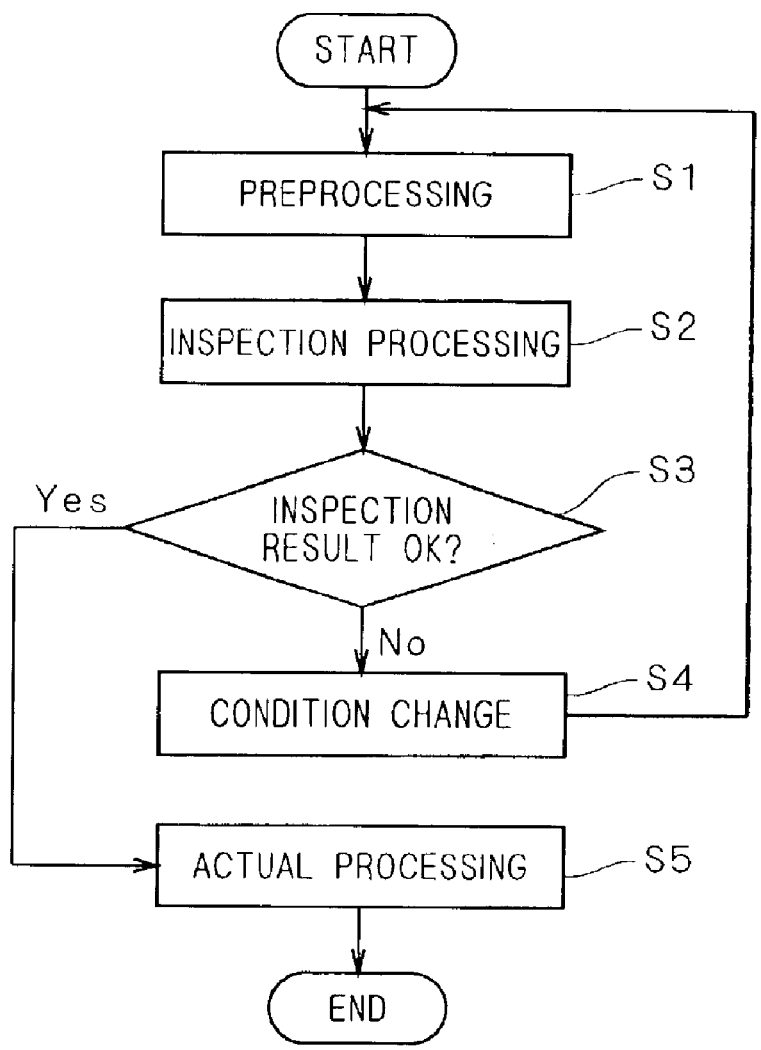
F I G . 5

F I G . 9
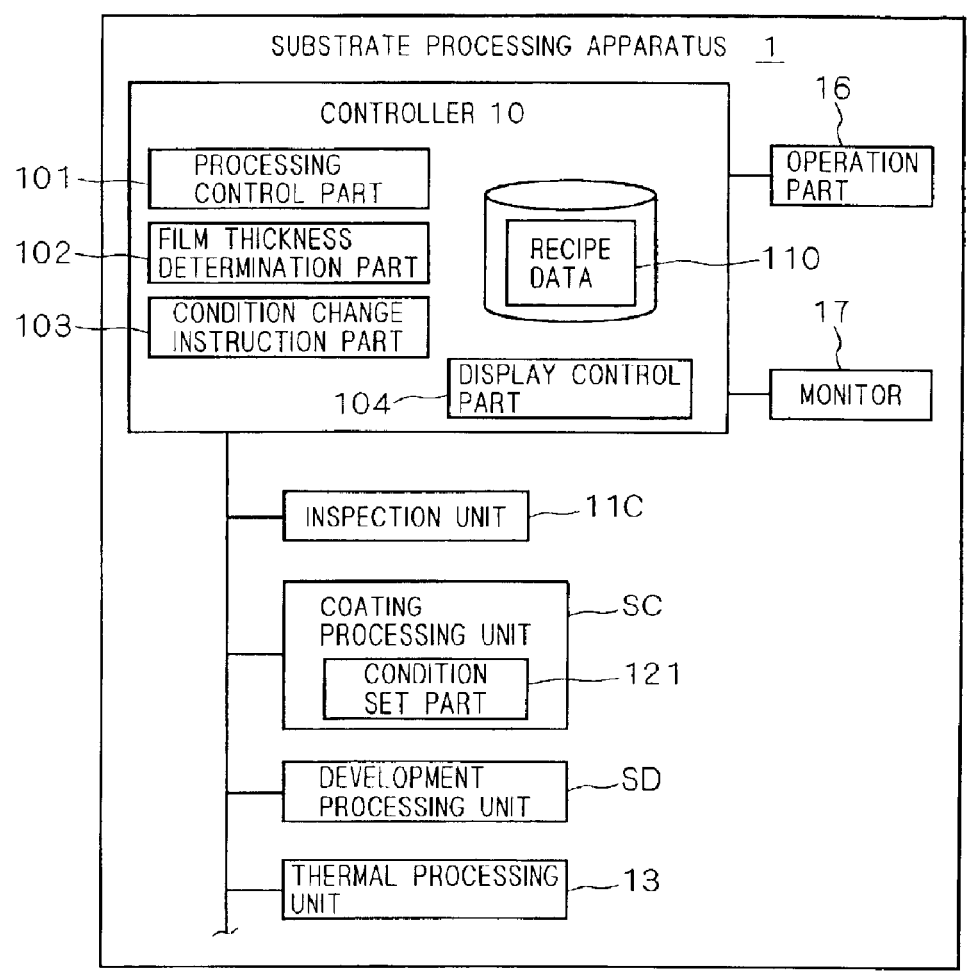

F I G . 1 2
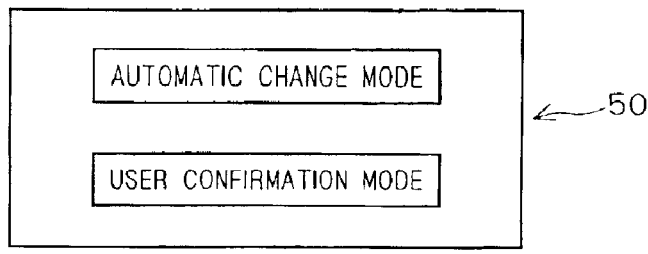
F I G . 1 3
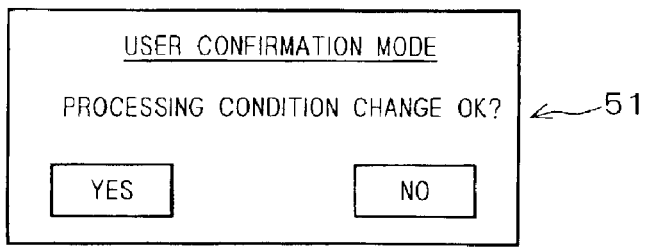
F I G . 1 4
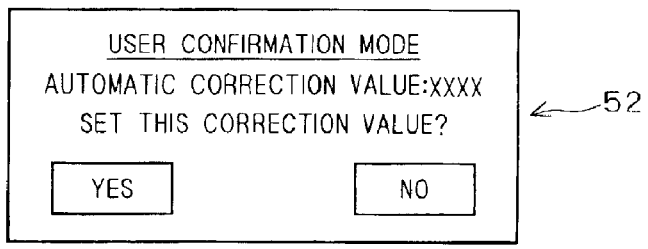
F I G . 1 5
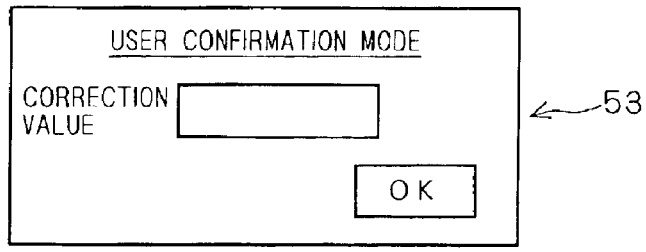

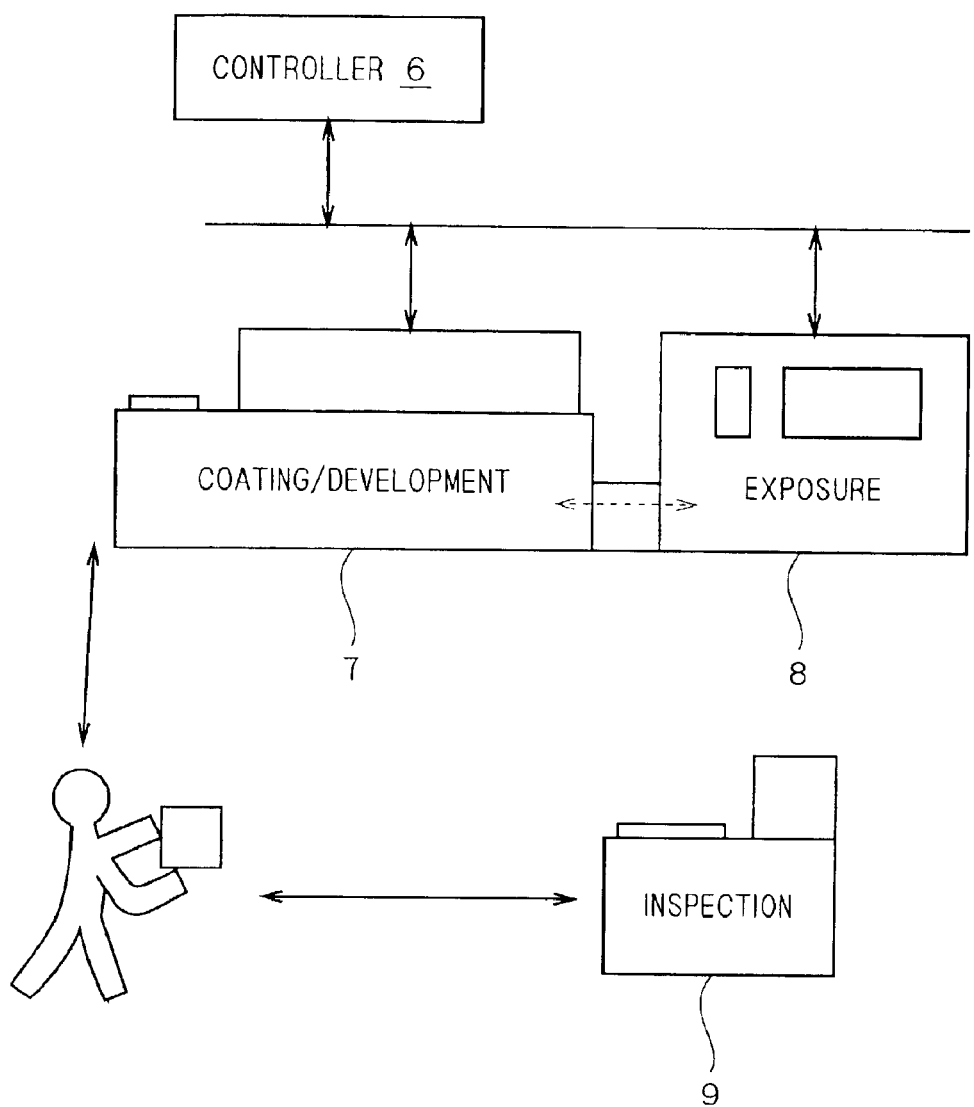

SUBSTRATE PROCESSING APPARATUS CONTROL SYSTEM AND SUBSTRATE PROCESSING APPARATUS

BACKGROUND OF THE INVENTION

1. Field of the Invention

The present invention relates to a technique of controlling a substrate processing apparatus having an inspection part built therein for performing prescribed inspections on a semiconductor substrate, a glass substrate for a liquid crystal display, a glass substrate for a photomask or a substrate for an optical disk (hereinafter simply referred to as "substrate").

2. Description of the Background Art

A product such as a semiconductor device or a liquid crystal display is manufactured by performing a series of processing such as cleaning, resist coating, exposure, development, etching, formation of an interlayer dielectric film, thermal processing, dicing and the like on the aforementioned substrate.

In order to maintain the quality of such a semiconductor product, it is important to inspect the substrate for confirming the quality thereof after the aforementioned processing. In general, therefore, the aforementioned series of processing is performed on a pilot substrate as preprocessing for inspecting the quality of the pilot substrate.

FIG. 16 schematically illustrates the structures of a conventional substrate processing apparatus 7 and a control system therefor. As shown in FIG. 16, the substrate processing apparatus 7 and an exposure apparatus 8 connected to the substrate processing apparatus 7 are connected to a controller 6, for performing a series of processing (coating, exposure and development) on substrates under control of the controller 6. An inspection apparatus 9 is arranged outside the substrate processing apparatus 7.

A preprocessed pilot substrate is stored in a dedicated carrier of the substrate processing apparatus 7. An operator carries the carrier to the inspection apparatus 9 for performing inspection processing therein.

When inspection results as to the pilot substrate are not satisfactory for quality requirements, the operator changes the processing condition of each processing part of the substrate processing apparatus 7 or the exposure apparatus 8, and performs the series of processing on a new pilot substrate again. The operator carries the preprocessed pilot substrate to the inspection apparatus 9 for performing inspection processing. The operator repeats such processing thereby optimizing the processing condition of each processing part. The operator ends the preprocessing when the processing condition is optimized, for starting actual substrate processing steps (the actual substrate processing steps are hereinafter referred to as "actual processing").

Thus, the operator performs quality inspections by preprocessing for starting actual processing when the quality satisfies the requirements, whereby high-quality substrates can be produced from the start time of the actual processing.

However, the operator must manually change the processing condition of each processing part in response to the inspection results of the preprocessing through extremely complicated processing. The operator must determine the contents of the processing condition to be changed from the inspection results for changing the processing condition of each processing part on the basis of the results of the determination.

Due to the structure of the inspection apparatus 9 provided outside the substrate processing apparatus 7, the operator must repeatedly carry the carrier as the case may be, leading to a heavy burden on the operator.

Thus, there are some problems as to inspection processing of the pilot substrate. While resist film thickness measurement is performed on a product lot in order to maintain the quality of semiconductor products, film thickness measurement on a bare wafer is performed as an apparatus check of the substrate processing apparatus 7 itself independently of the film thickness measurement on the product lot.

The film thickness measurement on the bare wafer is performed when the lot is changed or at the time of a daily check. The term "bare wafer" indicates a substrate formed with no pattern. While a part formed with no pattern must be selected for performing film thickness measurement as to a substrate already formed with a pattern, more correct film thickness measurement can be performed by measuring the film thickness in a state coating the bare wafer with resist.

As shown in FIG. 16, the substrate processing apparatus 7 executes a series of processing (coating and development) on substrates under control of the controller 6. The inspection apparatus 9 is arranged outside the substrate processing apparatus 7.

The dedicated carrier of the substrate processing apparatus 7 stores the bare wafer subjected to coating of resist in a coating processing unit (not shown) comprised in the substrate processing apparatus 7. The operator carries the carrier to the inspection apparatus 9, which in turn performs film thickness measurement.

When film thickness measurement results as to the bare wafer are not satisfactory for quality requirements, the operator changes the processing condition of the coating processing unit or a thermal processing unit (not shown) of the substrate processing apparatus 7, and performs resist coating processing on a new bare wafer again. The operator carries the bare wafer coated with the resist to the inspection apparatus 9 for performing film thickness measurement again. The operator repeats such processing thereby optimizing the processing condition of the coating processing unit. The operator ends the film thickness measurement when the processing condition is optimized.

However, the operator must manually change the processing condition of the coating processing unit or the thermal processing unit in response to the results of the film thickness measurement through extremely complicated processing. The operator must determine the contents of the processing condition to be changed from the measurement results for changing the processing condition of each unit on the basis of the results of the determination. In particular, the film thickness measurement with the bare wafer is performed every day as a daily check, and hence it follows that the overall processing efficiency is reduced when this operation is complicated.

Similarly to the inspection processing on the pilot substrate, the operator must repeatedly carry the carrier every time the film thickness measurement is performed due to the structure of the inspection apparatus 9 arranged outside the substrate processing apparatus 7, to result in a heavy burden of the operator.

SUMMARY OF THE INVENTION

The present invention is directed to a system controlling a substrate processing apparatus. The substrate processing apparatus comprises a processing part performing prescribed processing on a substrate and an inspection part performing a prescribed inspection on the substrate.

According to the present invention, the substrate processing apparatus control system comprises means inputting inspection results of a pilot substrate subjected to the prescribed processing as preprocessing in the inspection part and condition change means changing a processing condition of the processing part on the basis of the input inspection results.

The processing condition is efficiently optimized while a burden on an operator can be reduced.

According to an aspect of the present invention, the substrate processing apparatus control system comprises means performing control to repeat the preprocessing while changing the processing condition until the inspection results satisfy prescribed requirements and means performing control to start actual processing on the substrate after the said inspection results satisfy the prescribed requirements.

A high-quality substrate can be produced from an initial stage in actual substrate processing steps.

According to another aspect of the present invention, a substrate processing apparatus comprises a processing part coating a substrate with resist and an inspection part measuring the film thickness of the resist applied to the substrate, and a substrate processing apparatus control system comprises means performing control to carry a bare wafer coated with the resist to the inspection part while performing film thickness measurement, determination means receiving measurement results from the inspection part for determining whether or not a film thickness requirement is satisfied and condition change means changing a processing condition of the processing part when the determination means determines that the film thickness requirement is not satisfied.

Film thickness measurement on the bare wafer executed in a daily check of the apparatus or the like is automated. Thus, working efficiency is improved.

The present invention is also directed to a substrate processing apparatus.

A first object of the present invention is to efficiently reflect inspection results with respect to preprocessing in a substrate processing technique.

A second object of the present invention is to efficiently reflect results of film thickness measurement on a bare wafer in a substrate processing technique.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a flow chart showing feedback control in preprocessing;

FIG. 9 is a block diagram of a substrate processing apparatus control system according to the second embodiment;

FIG. 12 illustrates a menu screen for bare wafer thickness measurement;

FIG. 13 illustrates a confirmation screen for changing a processing condition;

FIG. 14 illustrates a confirmation screen for changing a correction value;

FIG. 15 illustrates a screen for inputting a correction value; and

FIG. 16 illustrates the structures of a conventional substrate processing apparatus and a system having an externally provided inspection apparatus.

DESCRIPTION OF THE PREFERRED EMBODIMENTS

<First Embodiment>

{1. Structure of Substrate Processing Apparatus}

Figure 1:
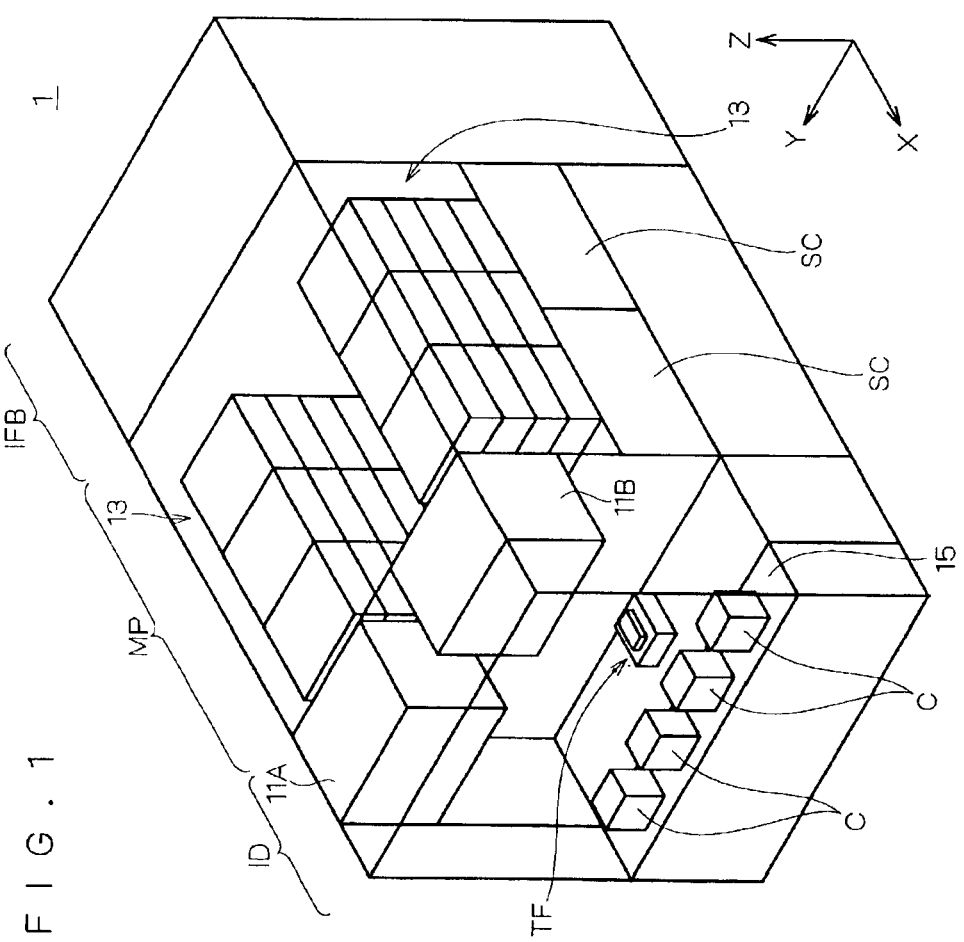
FIG. 1 is a perspective view showing a substrate processing apparatus according to a first embodiment of the present invention.

FIG. 1 is a perspective view schematically showing the overall structure of a substrate processing apparatus 1 according to a first embodiment of the present invention.

Figure 2:
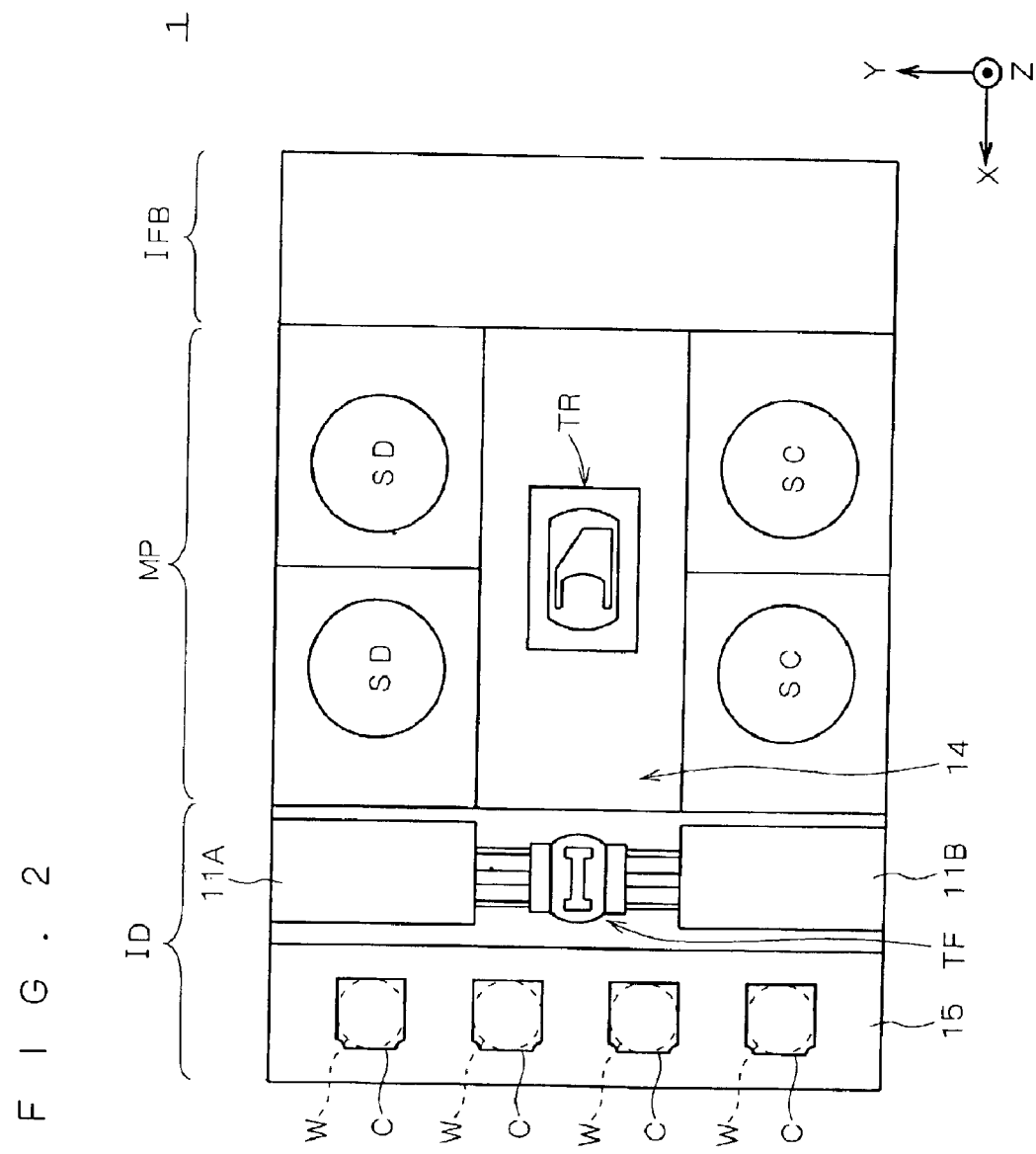
FIG. 2 is a plan view schematically showing the structure of the substrate processing apparatus according to the first embodiment.

FIG. 2 is a plan view schematically showing the structure of the substrate processing apparatus 1. Each of FIGS. 1 and 2 is provided with an XYZ Cartesian coordinate system with a Z-axis along the vertical direction and an X-Y plane along the horizontal plane. This substrate processing apparatus 1, performing resist coating processing and development processing on substrates W (the so-called coater & developer), is roughly formed by an indexer ID, a unit arrangement part MP and an interface IFB.

The indexer ID comprises a transfer robot TF, inspection units 11A and 11B (inspection part) and a receiving stage 15. Four carriers C can be arranged and placed on the receiving stage 15 along the horizontal direction (Y-axis direction). Each carrier C has a large number of stages of storage grooves each capable of storing a single substrate W in a horizontal posture (with the main surface along the horizontal plane). Therefore, each carrier C can store a plurality of substrates W (25 substrates W, for example) in a state horizontally stacked in a number of stages at prescribed intervals.

The inspection units 11A and 11B arranged in the indexer ID in this embodiment may alternatively be arranged in the unit arrangement part MP. The set positions of the inspection units 11A and 11B are not particularly restricted.

The transfer robot TF comprises a single transfer arm and can vertically operate, rotate and horizontally reciprocate the transfer arm. Further, the transfer robot TF can horizontally move the transfer arm along the Y-axis direction by moving along the Y direction itself. In other words, the transfer robot TF can three-dimensionally move the transfer arm.

According to such operation of the transfer robot TF, the indexer ID can take out unprocessed substrates W from the carriers C each capable of storing a plurality of substrates W and transfer the same to the unit arrangement part MP while receiving processed substrates W from the unit arrangement part MP and storing the same in the carriers C. The indexer ID also introduces/discharges the substrates W into/from the inspection units 11A and 11B through the transfer robot TF.

The inspection unit 11A is a macro defect inspection unit performing a macro defect inspection. The term "macro defect inspection" indicates an inspection determining presence/absence of adhesion of relatively large defects, such as particles, for example, appearing on the substrates W.

The inspection unit 11B performs resist film thickness measurement, pattern line width measurement and pattern superposition measurement. The term "resist film thickness measurement" indicates an inspection measuring the film thicknesses of resist applied onto the substrates W. The term "pattern line width measurement" indicates an inspection measuring the line widths of patterns formed on the substrates W by exposure and development. The term "pattern superposition measurement" indicates an inspection measuring displacement of the patterns formed on the substrates W by exposure and development.

A plurality of processing units performing prescribed processing on the substrates W are arranged on the unit arrangement part MP. Two coating processing units SC are arranged on the front side (-Y side) of the unit arrangement part MP. Each coating processing unit SC is the so-called spin coater dropping photoresist on the main surfaces of the substrates W while rotating the substrates W thereby performing uniform resist coating.

Two development processing units SD are arranged on the back side (+Y side) of the unit arrangement part MP to be flush with the coating processing units SC. Each development processing unit SD is the so-called spin developer supplying a developer onto the exposed substrates W thereby performing development processing. The coating processing units SC and the development processing units SD are opposed to each other through a transport path 14.

Thermal processing unit groups 13 (not shown in FIG. 2 for the convenience of illustration) are arranged above the two coating processing units SC and the two development processing units SD respectively through a fan filter unit (not shown). The so-called hot plates for heating the substrates W to a prescribed temperature and the so-called cool plates for cooling the substrates W to a prescribed temperature and maintaining the substrates W at the prescribed temperature are built into the thermal processing unit groups 13. The hot plates include adhesion reinforcement units performing adhesion reinforcement processing on the substrates W not yet coated with the resist and post-exposure baking units performing baking processing on the exposed substrates W. Throughout the specification, the hot plates and the cool plates are generically referred to as thermal processing units, and the coating processing units SC, the development processing units SD and the thermal processing units are generically referred to as processing units (processing parts).

A transport robot TR is arranged on the transport path 14 held between the coating processing units SC and the development processing units SD. The transport robot TR comprises two transport arms and can move the transport arms along the vertical direction, rotate the same in a horizontal plane and reciprocate the same in the horizontal plane. Thus, the transport robot TR can circulate/transport the substrates W between the processing units arranged on the unit arrangement part MP according to a prescribed procedure. The transport robot TR can also deliver the substrates W between the transfer robot TF of the indexer ID and the interface IFB.

The interface IFB has a function of receiving the substrates W coated with the resist from the unit arrangement part MP and transferring the same to the exposure apparatus 2 (shown in FIG. 3 etc.) while receiving the exposed substrates W from the exposure apparatus 2 and returning the same to the unit arrangement part MP. In order to implement this function, a delivery robot (not shown) for delivering the substrates W is arranged on the interface IFB. The interface IFB is also provided with a buffer part temporarily storing the substrates W for eliminating difference between processing times in the unit arrangement part MP and the exposure apparatus 2.

{2. Outline of Processing}

Processing in the substrate processing apparatus 1 having the aforementioned structure is now described. First, the transfer robot TF of the indexer ID takes out the unprocessed substrates W from the carriers C and transfers the same to the transport robot TR of the unit arrangement part MP.

The transport robot TR circulates/transports the substrates W transferred to the unit arrangement part MP between the processing units according to the prescribed procedure. More specifically, the transport robot TR transfers the substrates W subjected to adhesion reinforcement processing, resist coating processing and prebake processing to be formed with resist films to the exposure apparatus 2 through the interface IFB. The exposure apparatus 2 returns the substrates W subjected to exposure processing to the unit arrangement part MP through the interface IFB. The exposed substrates W are subjected to post-exposure baking and development processing. The developed substrates W are further baked and thereafter transferred from the transport robot TR of the unit arrangement part MP to the transfer robot TF of the indexer ID.

The transfer robot TF receiving the processed substrates W stores the substrates W in the carriers C.

{3. Inspection Processing}

While basic processing performed on the substrates W has been briefly described, the substrate processing apparatus 1 according to this embodiment also inspects the substrates W therein.

Among the inspections, the resist film thickness measurement is preferably performed on the prebaked substrates W not yet introduced into the exposure apparatus 2. In this case, the completely prebaked substrates W are temporarily returned from the unit arrangement part MP to the indexer ID, so that the transfer robot TF introduces the substrates W into the inspection unit 11B.

It follows that the transfer robot TF transfers the substrates W subjected to resist film thickness measurement from the inspection unit 11B to the unit arrangement part MP again and the transport robot TR of the unit arrangement part MP transfers the same to the interface IFB for introducing the substrates W into the exposure apparatus 2.

The macro defect inspection, the pattern line width measurement and the pattern superposition measurement are preferably performed on the substrates W completely processed and returned to the indexer ID. The transfer robot TF introduces the substrates W completely processed and returned to the indexer ID into the inspection unit 11A for performing the macro defect inspection. On the other hand, the transfer robot TF introduces the substrates W completely processed and returned to the indexer ID into the inspection unit 11B for performing the line width measurement and the pattern superposition measurement. In either case, the transfer robot TF receives the completely inspected substrates W from the inspection unit 11A or 11B and stores the same in the carriers C.

{4. Inspection Processing in Preprocessing}

Such quality inspections are performed at various timings. For example, there is a method of taking out substrates and performing a quality check periodically or in a sampling manner while executing actual processing on the substrates for changing any processing condition when requirements are not satisfied thereby improving the quality stepwise.

On the other hand, there is also a method of performing preprocessing on a pilot substrate before starting actual processing on substrates and performing a quality inspection on the preprocessed pilot substrate. According to this method optimizing processing conditions before starting actual processing, formation of defective substrates can be minimized.

The preprocessing is performed on the pilot substrate before starting processing in units of production lots. The pilot substrate subjected to the series of processing of coating, exposure and development is transported to the inspection unit 11A or 11B and subjected to the macro defect inspection or the line width measurement or the pattern superposition measurement.

The substrate processing apparatus 1 starts actual processing when inspection results in this preprocessing satisfy quality requirements. If the inspection results in the preprocessing do not satisfy the quality requirements, the processing condition of each processing part must be changed. The structure of a system performing feedback control in the preprocessing is now described.

{5. System Structure}

Figure 3:
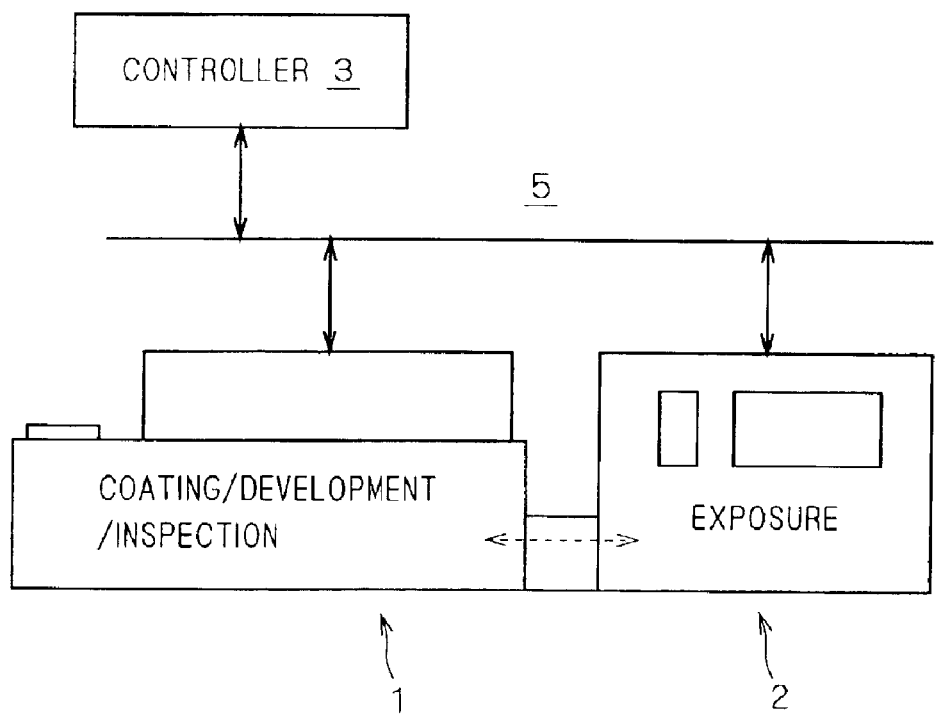
FIG. 3 schematically illustrates the whole of a substrate processing apparatus control system according to the first embodiment.

FIG. 3 schematically illustrates a substrate processing apparatus control system according to this embodiment formed by connecting the substrate processing apparatus 1 and a controller 3 with each other. The substrate processing apparatus 1 and the exposure apparatus 2 are connected to the controller 3 through a communication line 5, for executing coating, exposure, development and inspection processing under control of the controller 3.

Figure 4:
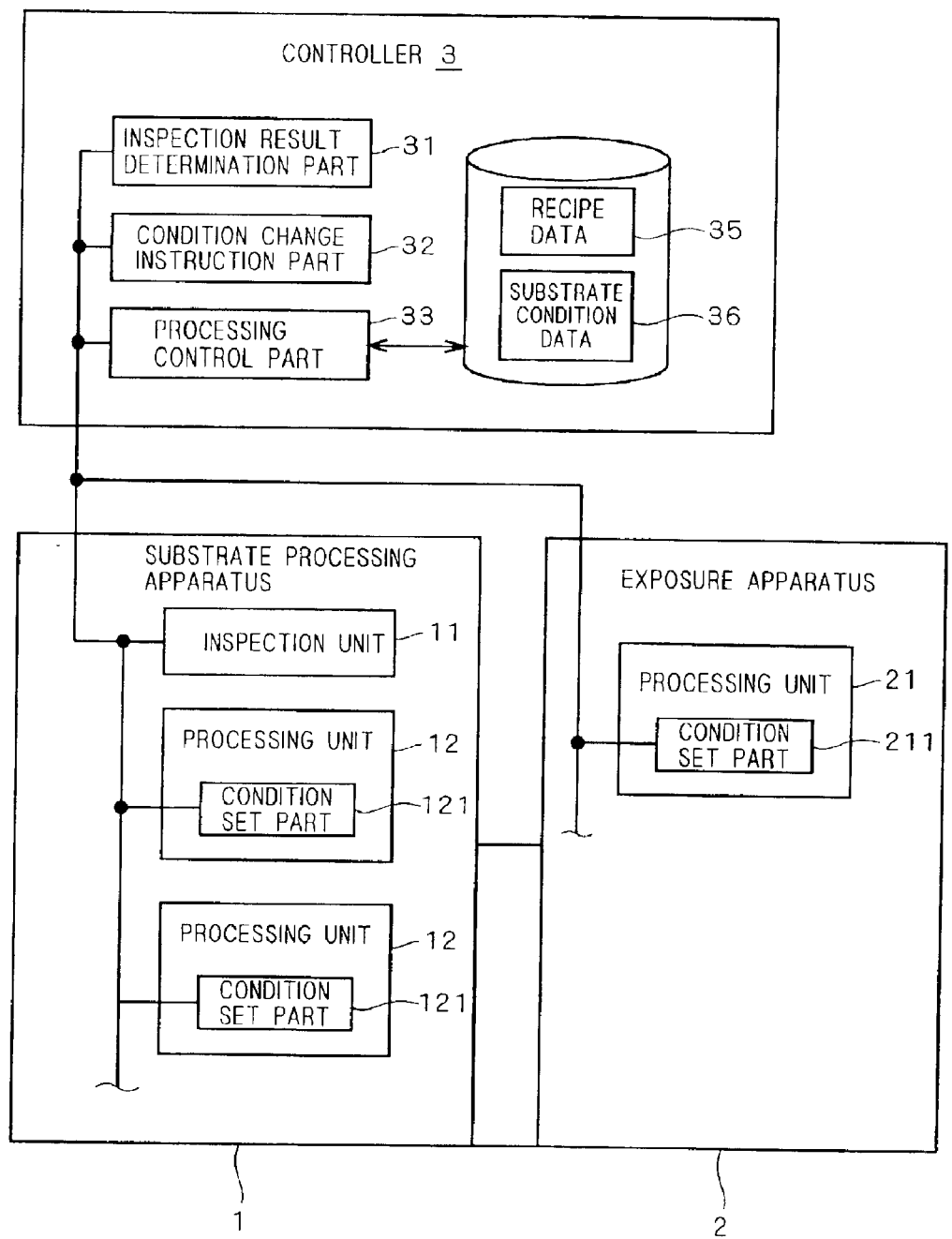
FIG. 4 is a block diagram of the substrate processing apparatus control system according to the first embodiment.

FIG. 4 is a block diagram of the control system. Referring to FIG. 4, numeral 12 generically denotes the processing units, i.e., the coating processing units SC, the development processing units SD and the thermal processing units provided on the substrate processing apparatus 1. Numeral 11 generically denotes the inspection units 11A and 11B. The controller 3 controls all of the inspection unit 11, the processing units 12, the transport robot TR and the transfer robot TF.

Each of the processing units 12 executes prescribed processing on the substrates W according to a condition set in each of condition set parts 121. Similarly, a processing unit 21 of the exposure apparatus 2 executes prescribed processing on the substrates W according to a condition set in a condition set part 211. The controller 3 changes the set contents in the condition set parts 121 and 211.

The controller 3 comprises a CPU serving as a body part performing arithmetic processing, a ROM, a RAM, a hard disk etc., and the ROM or the hard disk stores control software. An inspection result determination part 31, a condition change part 32 and a processing control part 33 are functions implementing the control software through hardware resources such as the CPU, the RAM etc.

A storage device such as the hard disk stores recipe data 35 and substrate condition data 36. The processing control part 33 controls the substrate processing apparatus 1 and the exposure apparatus 2 according to a procedure recorded in the recipe data 35. The substrate condition data 36 records quality requirements for the substrates W. The inspection result determination part 31 compares inspection results with the substrate condition data 36 for determining the inspection results.

{6. Feedback Control in Preprocessing}

Feedback control in the preprocessing utilizing the substrate processing apparatus 1, the exposure apparatus 2 and the control system described above is now described with reference to a flow chart shown in FIG. 5.

First, preprocessing is performed on a pilot substrate W (step S1). The preprocessing is performed when starting processing in units of lots, for example. More specifically, the series of processing (coating, exposure and development) is performed on the pilot substrate W taken out from any carrier C.

The pilot substrate W subjected to the series of processing is transported to the inspection unit 11, which in turn performs the aforementioned inspection processing on the pilot substrate W (step S2). As to the macro defect inspection, the pattern line width measurement and the pattern superposition measurement, the pilot substrate W is subjected to the inspection processing in the inspection units 11A and 11B after the same is returned to the indexer ID following completion of the entire processing. As to the film thickness measurement, the pilot substrate W is returned to the indexer ID after resist coating processing, and subjected to the inspection processing in the inspection unit 11B. Thus, the contents of the series of processing performed on the pilot substrate W vary with the inspection contents, while the controller 3 control these on the basis of the recipe data 35 set for the preprocessing.

When the inspection processing is completed, the inspection unit 11 transmits data of inspection results to the inspection result determination part 31. The inspection result determination part 31 compares the inspection results with the previously set quality requirements recorded in the substrate condition data 36 for determining whether or not the former satisfy the latter (step S3).

When determining that the inspection results satisfy the requirements, the inspection result determination part 31 transmits an instruction for starting actual processing to the processing control part 33. The processing control part 33 receiving this instruction starts actual processing according to a recipe recorded in the recipe data 35 (step S5).

When determining that the inspection results do not satisfy the requirements, on the other hand, the inspection result determination part 31 transmits an instruction for changing a processing condition to the condition change instruction part 32. The condition change instruction part 32 receiving this instruction changes the processing condition of the corresponding processing unit 12 or 21. More specifically, the condition change instruction part 32 changes the processing condition recorded in the processing condition part 121 or 211 of the processing unit 12 or 21 (step S4).

When the processing condition is changed, the processing control part 33 further transmits an instructional command for preprocessing. The substrate processing apparatus 1 and the exposure apparatus 2 receiving this instruction perform the series of processing on a new pilot substrate W. When the series of processing is completed, the inspection processing is performed again for determining inspection results similarly to the aforementioned processing. Thereafter the preprocessing and the inspection processing are repeated until the inspection results satisfy the quality requirements. When the inspection results finally satisfy the requirements, the preprocessing is ended for starting actual processing.

As hereinabove described, the control system for the substrate processing apparatus 1 according to this embodiment automating execution of preprocessing, effectiveness/defectiveness determination of inspection results and feedback to the processing condition in response to the inspection results can efficiently optimize the processing condition. When introducing the carriers C and specifying processing conditions and inspection conditions, the apparatus 1 automatically performs preprocessing and actual processing, whereby the burden on the operator can be abated. Further, the controller 3 can collectively manage the processing conditions, the inspection conditions and the inspection results.

According to this embodiment, an inspection apparatus is arranged in the substrate processing apparatus 1. Thus, the transfer robot TF transports the substrates W to the inspection unit 11, so that the operator may not carry any carrier C storing the pilot substrates W in the preprocessing. Further, mechanisms provided in the substrate processing apparatus (coating/development apparatus) 1 can be employed as a carrier and a substrate handling mechanism required for the inspection apparatus. The footprint in a clean room necessary for coating/exposure/development/inspections of the substrates W can be reduced.

While the two inspection units 11A and 11B are arranged in the indexer ID in the aforementioned embodiment, the present invention is not restricted to this but one or at least two inspection units may be employed. The inspection unit(s) may not restrictively be arranged in the indexer ID but may alternatively be arranged in the unit arrangement part MP or the interface IFB, or may be externally attached to the substrate processing apparatus 1. Each inspection unit 11 may be made to perform at least one inspection among the film thickness measurement for measuring the film thicknesses of the resist, the line width measurement for measuring the line widths of the patterns, the superposition measurement for measuring the superposition of the patterns and the macro defect inspection.

{7. Modification}

While the controller 3 is connected to the substrate processing apparatus 1 through the communication line 5 in the aforementioned embodiment, the physical set position of the controller 3 is not particularly restricted.

Figure 6:
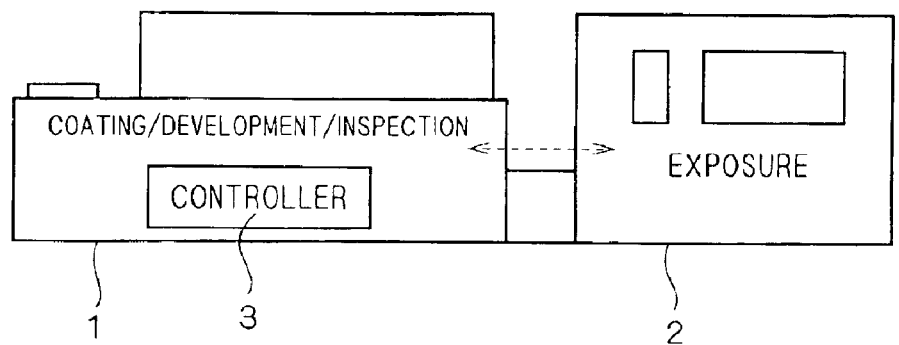
FIG. 6 illustrates a modification of the substrate processing apparatus according to the first embodiment, having a controller built therein.

For example, a controller 3 may alternatively be stored in a substrate processing apparatus 1, as shown in FIG. 6. Referring to FIG. 6, it is assumed that the structures of the substrate processing apparatus 1, an exposure apparatus 2 etc. are similar to those of the first embodiment shown in FIGS. 1 to 4 except the controller 3 stored in the substrate processing apparatus 1.

According to this structure, an inspection apparatus and the controller 3 are entirely stored in the substrate processing apparatus 1 and hence the footprint in a clean room can be further reduced. When an operation part of the controller 3 is provided on a side portion of the substrate processing apparatus 1 or the like, the controller 3 can perform control on the same place as the substrate processing apparatus 1, whereby work efficiency is improved for attaining excellent convenience. Wiring of a communication line etc. set in the clean room can be simplified by building the controller 3 into the substrate processing apparatus 1.

<Second Embodiment>

{1. Structure of Substrate Processing Apparatus}

Figure 7:
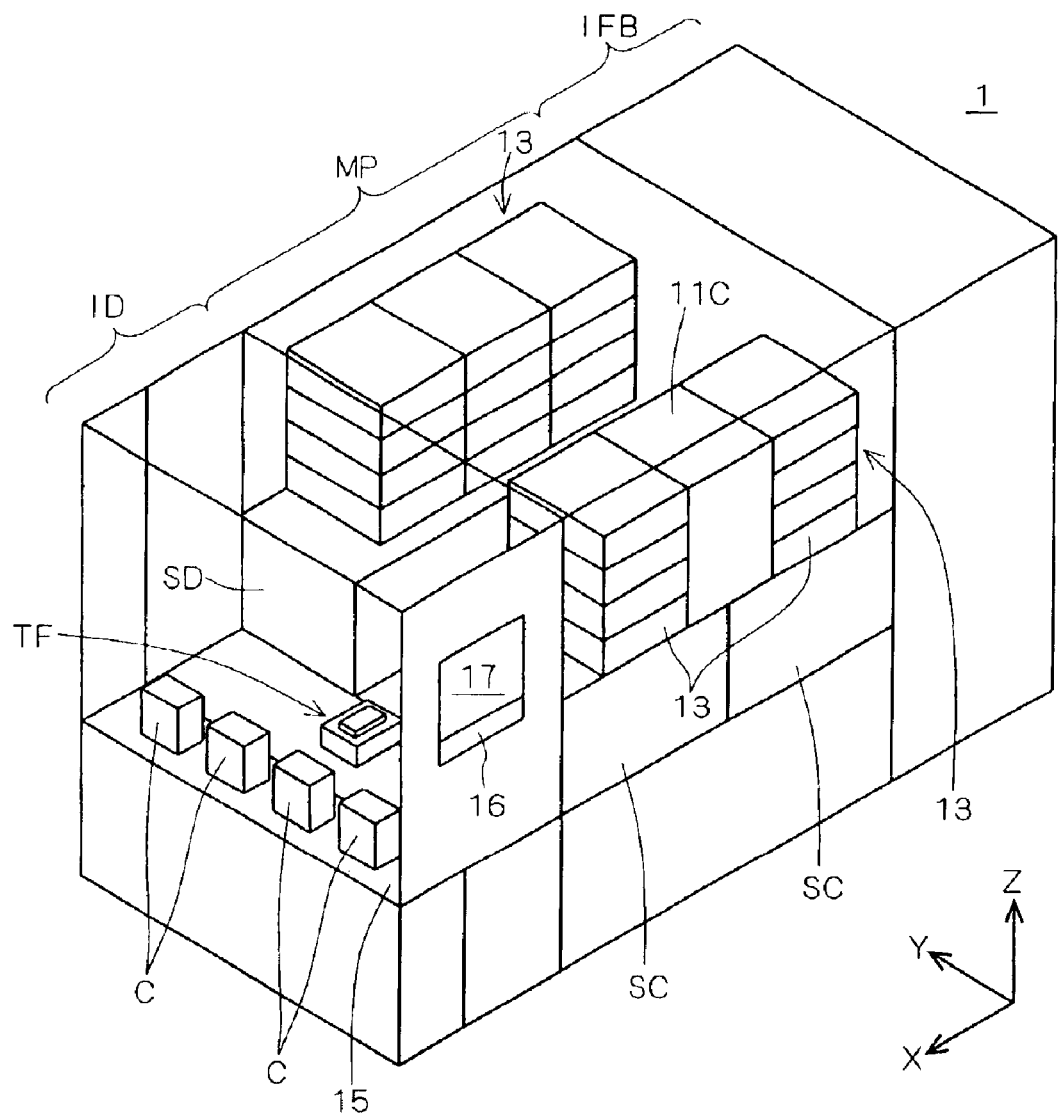
FIG. 7 is a perspective view showing the whole of a substrate processing apparatus according to a second embodiment of the present invention.
Figure 8:
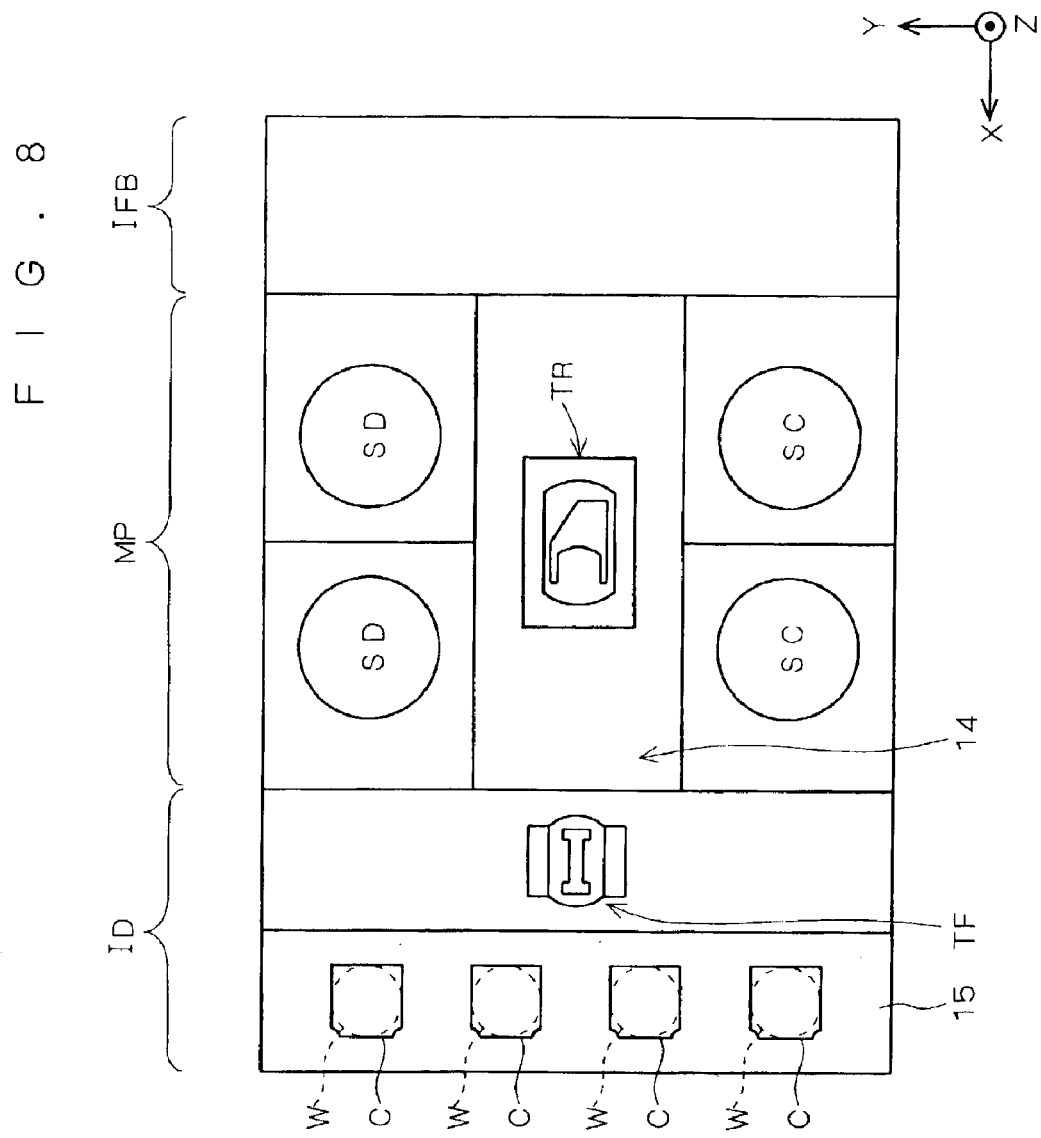
FIG. 8 is a plan view schematically showing the structure of the substrate processing apparatus according to the second embodiment.

FIG. 7 is a perspective view schematically showing the overall structure of a substrate processing apparatus 1 according to a second embodiment of the present invention. FIG. 8 is a plan view schematically showing the structure of the substrate processing apparatus 1. Each of FIGS. 7 and 8 is provided with an XYZ Cartesian coordinate system with a Z-axis along the vertical direction and an X-Y plane along the horizontal plane. This substrate processing apparatus 1, performing resist coating processing and development processing on substrates W (the so-called coater & developer), is roughly formed by an indexer ID, a unit arrangement part MP and an interface IFB.

The indexer ID comprises a transfer robot TF and a receiving stage 15. Four carriers C can be arranged and placed on the receiving stage 15 along the horizontal direction (Y-axis direction). Each carrier C has a large number of stages of storage grooves each capable of storing a single substrate W in a horizontal posture (with the main surface along the horizontal plane). Therefore, each carrier C can store a plurality of substrates W (25 substrates W, for example) in a state horizontally stacked in a number of stages at prescribed intervals.

The transfer robot TF comprises a single transfer arm and can vertically operate, rotate and horizontally reciprocate the transfer arm. Further, the transfer robot TF can horizontally move the transfer arm along the Y-axis direction by moving along the Y direction itself. In other words, the transfer robot TF can three-dimensionally move the transfer arm.

According to such operation of the transfer robot TF, the indexer ID can take out unprocessed substrates W from the carriers C each capable of storing a plurality of substrates W and transfer the same to the unit arrangement part MP while receiving processed substrates W from the unit arrangement part MP and storing the same in the carriers C.

A plurality of processing units performing prescribed processing on the substrates W are arranged on the unit arrangement part MP. Two coating processing units SC are arranged on the front side (−Y side) of the unit arrangement part MP. Each coating processing unit SC is the so-called spin coater dropping photoresist on the main surfaces of the substrates W while rotating the substrates W thereby performing uniform resist coating.

Two development processing units SD are arranged on the back side (+Y side) of the unit arrangement part MP to be flush with the coating processing units SC. Each development processing unit SD is the so-called spin developer supplying a developer onto the exposed substrates W thereby performing development processing. The coating processing units SC and the development processing units SD are opposed to each other through a transport path 14.

Thermal processing unit groups 13 (not shown in FIG. 8 for the convenience of illustration) are arranged above the two coating processing units SC and the two development processing units SD respectively through a fan filter unit (not shown). The so-called hot plates for heating the substrates W to a prescribed temperature and the so-called cool plates for cooling the substrates W to a prescribed temperature while maintaining the substrates W at the prescribed temperature are built into the thermal processing unit groups 13. The hot plates include adhesion reinforcement units performing adhesion reinforcement processing on the substrates W not yet coated with the resist and post-exposure baking units performing baking processing on the exposed substrates W. Throughout the specification, the hot plates and the cool plates are generically referred to as thermal processing units, and the coating processing units SC, the development processing units SD and the thermal processing units are generically referred to as processing units (processing parts).

As shown in FIG. 7, a film thickness inspection unit 11C is arranged on a portion of either thermal processing unit group 13. The film thickness inspection unit 11C performs an inspection of measuring the film thicknesses of resist applied onto the substrates W.

The indexer ID is also provided with another inspection unit (not shown). This inspection unit performs pattern line width measurement, pattern superposition measurement, macro defect measurement etc.

A transport robot TR is arranged on the transport path 14 held between the coating processing units SC and the development processing units SD. The transport robot TR comprises two transport arms and can move the transport arms along the vertical direction, rotate the same in a horizontal plane and reciprocate the same in the horizontal plane. Thus, the transport robot TR can circulate/transport the substrates W between the processing units arranged on the unit arrangement part MP according to a prescribed procedure. The transport robot TR can also deliver the substrates W between the transfer robot TF of the indexer ID and the interface IFB. Further, the transport robot TR also has a function of transporting the substrates W coated with the resist to the film thickness inspection unit 11C and receiving the substrates W subjected to film thickness measurement in the film thickness inspection unit 11C and transporting the same to a prescribed position.

The interface IFB has a function of receiving the substrates W coated with the resist from the unit arrangement part MP and transferring the same to an exposure apparatus (not shown) while receiving the exposed substrates W from the exposure apparatus and returning the same to the unit arrangement part MP. In order to implement this function, a delivery robot (not shown) for delivering the substrates W is arranged on the interface IFB. The interface IFB is also provided with a buffer part temporarily storing the substrates W for eliminating difference between processing times in the unit arrangement part MP and the exposure apparatus.

{2. Outline of Processing}

Processing in the substrate processing apparatus 1 having the aforementioned structure is now described. First, the transfer robot TF of the indexer ID takes out the unprocessed substrates W from the carriers C and transfers the same to the transport robot TR of the unit arrangement part MP.

The transport robot TR circulates/transports the substrates W transferred to the unit arrangement part MP between the processing units according to the prescribed procedure. More specifically, the transport robot TR transfers the substrates W subjected to adhesion reinforcement processing, resist coating processing and prebake processing to be formed with resist films to the exposure apparatus 2 through the interface IFB. The exposure apparatus 2 returns the substrates W subjected to exposure processing to the unit arrangement part MP through the interface IFB. The exposed substrates W are subjected to post-exposure baking and development processing. The developed substrates W are further baked and thereafter transferred from the transport robot TR of the unit arrangement part MP to the transfer robot TF of the indexer ID. The transfer robot TF receiving the processed substrates W stores the substrates W in the carriers C.

{3. Inspection Processing}

While basic processing performed on the substrates W has been briefly described, the substrate processing apparatus 1 according to this embodiment also performs inspection processing such as resist film thickness measurement therein.

Resist film thickness measurement is preferably performed on the substrates W subjected to prebaking but not yet introduced into the exposure apparatus. In this case, the transport robot TR introduces the completely prebaked substrates W into the inspection unit 11C. It follows that the substrates W completely subjected to the resist film thickness measurement are transported by the transport robot TR, transferred to the interface IFB and introduced into the exposure apparatus. Thus, the substrate processing apparatus 1 measures the thicknesses of the resist films and performs the quality inspection while executing processing on the substrates W in product lots.

The substrate processing apparatus 1 performs film thickness measurement employing a bare wafer in a daily check or the like, independently of the inspection on the substrates W in the product lots. This film thickness measurement is particularly referred to as "bare wafer film thickness measurement". The term "bare wafer" indicates a substrate formed with no pattern (not yet exposed).

While the aforementioned film thickness measurement on the product lots is executed as a quality check of the products, the bare wafer film thickness measurement is generally performed as an apparatus check of the substrate processing apparatus 1 itself. In other words, more correct film thickness measurement can be performed on a substrate formed with no pattern, and hence the apparatus 1 itself is checked on the basis of the measured value.

When the bare wafer is set in any carrier C, the transfer robot TF takes out the bare wafer and transfers the same to the transport robot TR. The transport robot TR transports the bare wafer to either coating processing unit SC, which in turn performs resist coating processing. The transport robot TR transfers the bare wafer coated with the resist to the thermal processing unit, which in turn performs prebaking. The transport robot TR transports the prebaked bare wafer to the film thickness inspection unit 11C.

The film thickness inspection unit 11C performs film thickness measurement on the bare wafer subjected to resist coating processing and prebaking. The transport robot TR transfers the bare wafer subjected to film thickness measurement to the transfer robot TF, which in turn stores the bare wafer in the carrier C.

Thus, in the bare wafer film thickness measurement, the bare wafer subjected to film thickness measurement is not transported to the exposure apparatus but returned to the indexer ID dissimilarly to the aforementioned film thickness measurement employing the product lots.

{4. System Structure}

FIG. 9 is a block diagram of the substrate processing apparatus 1 and a control system therefor according to this embodiment. The substrate processing apparatus 1 executes coating, development and inspection processing under control of a controller 10. Each coating processing unit SC executes prescribed processing on the substrates W according to a condition set in a condition set part 121.

The controller 10 comprises a CPU serving as a body part performing arithmetic processing, a ROM, a RAM, a hard disk etc., and the ROM or the hard disk stores control software. A processing control part 101, a film thickness determination part 102, a condition change instruction part 103 and a display control part 104 are functions implementing the control software through hardware resources such as the CPU, the RAM etc. An operation part 16 for operator manipulation and a monitor 17 for displaying an operation guidance, a menu etc. are provided on a side surface of the substrate processing apparatus 1. A storage device such as the hard disk stores recipe data 110, so that the processing control part 101 controls the substrate prosing apparatus 1 according to a procedure recorded in the recipe data 100.

{5. Feedback Control in Film Thickness Measurement}

Feedback control of the film thickness measurement utilizing the aforementioned substrate processing apparatus 1 and the control system is now described with reference to flow charts shown in FIGS. 10 and 11.

First, the operator issues a processing instruction for the bare wafer film thickness measurement through the operation part 16. The processing control part 101 receiving the processing instruction for the bare wafer film thickness measurement issues a menu display instruction to the display control part 104. The display control part 104 receiving this instruction makes the monitor 17 display a menu 50 shown in FIG. 12.

The menu 50 displays two modes, i.e., an "automatic change mode" and a "user confirmation mode". In the "automatic change mode", the controller 10 automatically performs feedback control with no user confirmation. When the operator selects the automatic change mode, therefore, no operation is required until the film thickness measurement and the feedback control thereof are completed. On the other hand, the "user confirmation mode" temporarily requires user confirmation for changing the processing condition of any processing unit in response to the results of the film thickness measurement. Therefore, the processing is progressed with user confirmation in the user confirmation mode.

The processing condition of any processing unit may be changed by a method of changing the spin rotational frequency of either coating processing unit SC, a method of changing the baking temperature (temperature for prebaking) of the thermal processing unit or the like. The following description is made with reference to the method of changing the spin rotational number.

Figure 10:
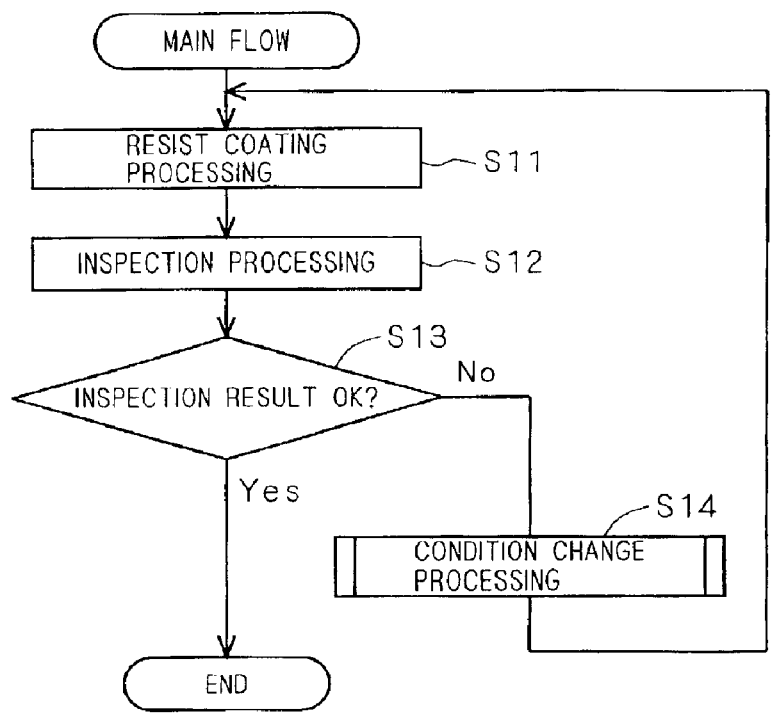
FIGS. 10 and 11 are flow charts showing feedback control for bare wafer thickness measurement.

When the operator selects either mode on the menu 50, resist coating processing is started on the bare wafer set on any carrier C (step S11 in FIG. 10). The bare wafer coated with the resist is prebaked and thereafter transferred to the film thickness inspection unit 11C to be subjected to film thickness measurement (step S12).

When the film thickness measurement is ended, the film thickness inspection unit 11C transmits data of the inspection result to the film thickness determination part 102. The film thickness determination part 102 compares the inspection result with a previously set quality requirement recorded in the recipe data 110 and determines whether or not the requirement is satisfied (step S13). More specifically, the quality requirement is the tolerance for the film thickness. When the measurement result of the film thickness is within the tolerance, it follows that the inspection result is OK.

When the film thickness determination part 102 determines that the inspection result satisfies the requirement (Yes at the step S13), the bare wafer film thickness measurement is ended. When the film thickness determination part 102 determines that the inspection result does not satisfy the requirement (No at the step S13), the process advances to condition change processing (step S14).

Figure 11:
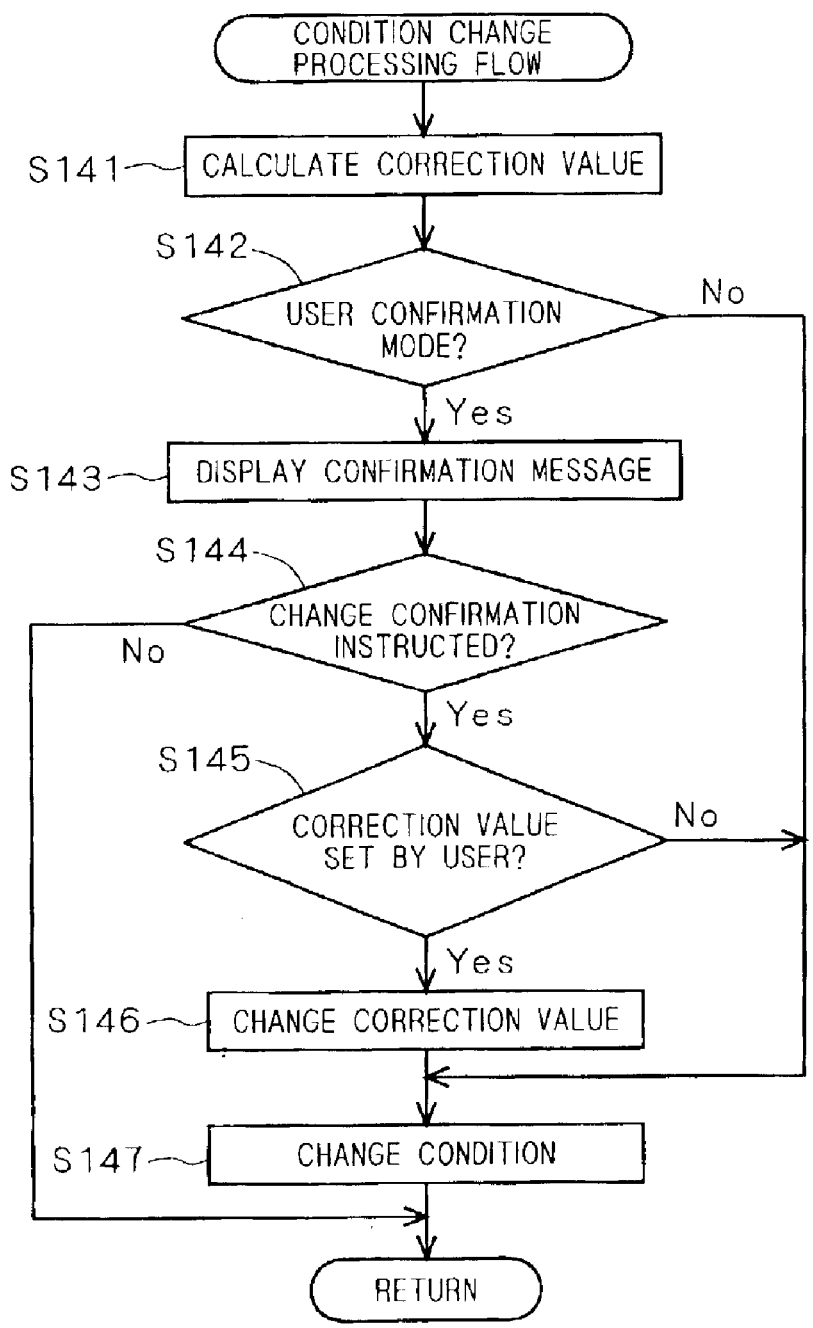

FIG. 11 is a detailed flow chart of the condition change processing (step S14). Upon transition to the condition change processing, the processing control part 101 first calculates a correction value for changing the processing condition of the processing part (either coating processing unit SC in this example) (step S141).

A method of obtaining the correction value for the spin rotational frequency of the coating processing unit SC is now described. In this embodiment, control is so performed as to change the correction value ($\alpha$) with respect to the basic spin rotational frequency without changing the basic spin rotational frequency.

The relation between the rotational frequency and the film thickness is expressed as follows:

$$T = K/(X^Y) \quad (1)$$

where T represents a target film thickness, X represents the basic spin rotational frequency, and K and Y represent constants, which are coefficients for calculating the target film thickness T. The target film thickness T and the formula are subject to every recipe, and the operator can register the target film thickness T and the formula and set the coefficients K and Y by manipulating the operation part 16.

Assuming that $\alpha$ represents the correction value, the relation is expressed as follows when the spin rotational frequency is offset:

$$(X+\alpha)^Y = K/T \quad (2)$$

Arranging the formula (2), the correction value ($\alpha$) can be expressed as follows:

$$\alpha = e^{(ln(K/T))/Y} - X \quad (3)$$

The recipe data 10 describes the target film thickness T as the requirement. Therefore, the spin rotational frequency X can be obtained from the target film thickness T through the formula (1). Thus, the coating processing unit SC executes processing at the spin rotational frequency X obtained from the relation expressed in the formula (1) as the initial condition.

When the film thickness is not within the tolerance as a result of processing under the initial condition, the target film thickness T is increased or decreased for substituting the changed target film thickness T in the formula (3), thereby calculating the correction value $\alpha$. Thus, the correction value is automatically calculated at the step S141 with the formula (3).

Upon calculation of the correction value, the processing control part 101 determines the mode (step S142). When the operator selects the automatic change mode (No at the step S142), the process advances to a step S147 for performing condition change processing with the correction value obtained at the step S141. The step S147 is described later.

When the operator selects the user confirmation mode (Yes at the step S142), on the other hand, the monitor 17 displays a confirmation screen 51 shown in FIG. 13 (step S143). The display control part 104 displays the confirmation screen 51 according to an instruction from the processing control part 101.

The confirmation screen 51 displays a confirmation message such as "processing condition change OK?". When the operator selects "No" (No at a step S144), the condition change processing flow is ended. Thus, the processing can be carefully progressed through intervention of the operator's intension.

When the operator selects "Yes" (Yes at the step S144), the monitor 17 displays a correction value set screen 52 shown in FIG. 14. This screen 52 displays a message such as "Automatic correction value: xxxx. Set this correction value?" (xxxx denotes the correction value a automatically calculated at the step S141), for confirming whether the operator utilizes the correction value a automatically calculated by the controller 10 at the step S141 or the operator him/herself decides the correction value α. If the operator selects "Yes" (No at the step S145), the processing condition is changed with the correction value a calculated at the step S141 (step S147).

If the operator selects "No" (Yes at the step S145), on the other hand, the monitor 17 displays a correction value input screen 53 shown in FIG. 15, so that the operator can input the correction value (α). The condition change instruction part 103 inputs the correction value specified by the operator and changes the correction value calculated at the step S141 (step S146).

Thus, the correction value can be changed through manipulation by the operator, whereby the degree of freedom in feedback control after film thickness measurement can be improved.

When the correction value is automatically set at the step S141 or set by the operator manipulation at the step S146 in the aforementioned manner, the condition change instruction part 103 changes the spin rotational frequency of the coating processing unit SC on the basis of this correction value (step S147). More specifically, the condition change part 103 changes the set contents (spin rotational frequency) of the condition set part 121 defining the processing condition of the coating processing unit SC.

When the condition change instruction part 103 changes the spin rotational frequency of the coating processing unit SC in the aforementioned manner, the process returns to the step S11 in the main flow shown in FIG. 10, for performing resist coating processing. Film thickness measurement is similarly performed with repetition of determination and condition change. When the film thickness finally satisfies the requirement, the processing is ended.

As hereinabove described, the control system for the substrate processing apparatus 1 according to this embodiment automatically performs film thickness measurement with the bare wafer while automatically (or manually) changing the condition of the processing unit, whereby a film thickness check can be readily executed as the daily check of the apparatus 1. Particularly in the automatic change mode, film thickness adjustment is automatically performed with remarkable convenience when the operator simply sets the bare wafer on the carrier C and manipulates the operation part 16 for selecting the menu.

This embodiment has been described with reference to the case of performing bare wafer film thickness measurement while determining the measurement result for feedback-controlling the spin rotational frequency of the coating processing unit SC. However, the film thickness may alternatively be adjusted by another method such as that of adjusting the prebaking temperature as hereinabove described, and the adjustment of the spin rotational frequency is a mere example. Further alternatively, a plurality of processing conditions may be simultaneously changed.

Also when performing feedback control by film thickness measurement on the thermal processing unit, the "automatic change mode" and the "user confirmation mode" may be rendered selectable similarly to the aforementioned embodiment. In other words, whether to automatically change the temperature for prebake processing for performing feedback control or to change the temperature condition with confirmation of the operator may be rendered selectable.

When a mode for automatically changing the temperature for prebake processing by the controller 10 and a mode for inputting the temperature condition by the operator him/herself are rendered selectable, feedback control having a high degree of freedom is enabled.

According to this embodiment, an inspection apparatus is arranged in the substrate processing apparatus 1. Thus, the transport robot TR transports the substrates W to the inspection unit 11C, whereby the operator may not carry a carrier storing a substrate for the inspection to the inspection apparatus.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus control system controlling a substrate processing apparatus comprising:
   a supply that provides at least one bare wafer stored in a carrier wherein each of said at least one bare wafer is constituted by a substrate with no pattern formed thereon;
   a processing part performing prescribed processing on said at least one bare wafer,
   an inspection part measuring the film thickness of resist applied to said at least one bare wafer; and
   an operation part receiving manipulation instructions from an operator,
   said processing part including a resist coating processing part coating said at least one bare wafer with said resist; and
   a prebake part performing thermal processing on said at least one bare wafer with said resist,
   said substrate processing apparatus control system comprising:
   a) means performing control to transport said at least one bare wafer taken out from said carrier and subjected to resist coating processing and prebaking to said inspection part, while storing said at least one bare wafer in said carrier after completion of film thickness measurement at said inspection part, said means performing control being operative when said operator manipulates said operation part to select a bare wafer film thickness measurement mode as an inspection mode;
   b) determination means receiving measurement results from said inspection part for determining whether or not a film thickness requirement is satisfied; and
   c) condition change means changing a processing condition of said processing part when said determination means determines that said film thickness requirement is not satisfied.

2. A substrate processing apparatus comprising a processing part performing prescribed processing on at least one bare wafer, said processing part including a resist coating processing part coating said at least one bare wafer with resist, and a prebake part performing thermal processing on said at least one bare wafer with said resist, said at least one bare wafer being a substrate with no pattern thereon;
   said substrate processing apparatus further comprising:
   a) an operation part receiving manipulation instructions from an operator,
   b) an inspection part measuring the film thickness of said resist applied to said at least one bare wafer;

c) means performing control to transport said at least one bare wafer taken out from a carrier and subjected to resist coating processing and prebaking to said inspection part, while storing said at least one bare wafer in said carrier after completion of film thickness measurement at said inspection part, said means performing control being operative when said operator manipulates said operation part to select a bare wafer film thickness measurement mode as an inspection mode;

d) determination means receiving measurement results from said inspection part for determining whether or not a film thickness requirement is satisfied; and e) condition change means changing a processing condition of said processing part when said determination means determines that said film thickness requirement is not satisfied.

3. A system for controlling a substrate processing apparatus comprising:

a supply that provides at least one bare wafer stored in a carrier wherein each of said at least one bare wafer is constituted by a substrate with no pattern formed thereon;

a processing part performing prescribed processing on said at least one bare wafer, and an inspection part measuring the film thickness of resist applied to said at least one bare wafer, said processing part including a resist coating processing part coating said at least one bare wafer with said resist, a prebake part performing thermal processing on said at least one bare wafer with said resist, and an operation part receiving manipulation instructions from an operator, a computer facility which comprises:

a) means performing control to transport said at least one bare wafer to said inspection part, while storing said at least one bare wafer in said carrier after completion of film thickness measurement at said inspection part, said means performing control being operative when said operator manipulates said operation part to select a bare wafer film thickness measurement mode as an inspection mode;

b) determination means receiving measurement results from said inspection part for determining whether or not a film thickness requirement is satisfied, and c) condition change means changing a processing condition of said processing part when said determination part determines that said film thickness requirement is not satisfied.

4. A method for processing substrates, the method comprising the steps of:

a) receiving an input from an operation part to select an inspection mode;

b) when a bare wafer film thickness measurement mode is selected as said inspection mode in said step a), providing a supply of bare wafers taken out from a carrier, wherein each of said bare wafers is constituted by a substrate formed with no pattern thereon;

c) forming a resist layer of even thickness on said bare wafers;

d) after said step c), performing prebaking on said bare wafers;

e) after said step d), carrying out a thickness measurement of said resist formed on said bare wafer by taking at least one thickness measurement on the surface of said resist;

f) receiving measurement results of said measurements and determining whether or not a given film thickness requirement has been satisfied;

g) altering processing conditions of said method, when said thickness determination determines that said film thickness requirement has not been satisfied; and h) after said step e), returning said bare wafers to said carrier.

5. The substrate processing apparatus control system according to claim 1, wherein when said operator manipulates said operation part to select a product lot measurement mode as said inspection mode, said means performing control is operative to transport substrates in a product lot taken out from said carrier and subjected to resist coating processing and prebaking to said inspection part, while carrying said substrates into an exposure apparatus after completion of film thickness measurement at said inspection part.

6. The substrate processing apparatus control system according to claim 5, wherein said condition change means comprises:

c-1) means displaying a confirmation message for condition change on a display comprised in said substrate processing apparatus before changing said processing condition of said processing part.

7. The substrate processing apparatus control system according to claim 6, wherein said condition change means comprises:

c-2) means making a user input the contents of change of said processing condition.

8. The substrate processing apparatus according to claim 2, wherein when said operator manipulates said operation part to select a product lot measurement mode as said inspection mode, said means performing control is operative to transport substrates in a product lot taken out from said carrier and subjected to resist coating processing and prebaking to said inspection part, while carrying said substrates into an exposure apparatus after completion of film thickness measurement at said inspection part.

9. The substrate processing apparatus according to claim 8, wherein said condition change means comprises:

e-1) means displaying a confirmation message for condition change on a display comprised in said substrate processing apparatus before changing said processing condition of said processing part.

10. The substrate processing apparatus according to claim 9, wherein said condition change means comprises:

e-2) means making a user input the contents of change of said processing condition.

11. The program according to claim 3, wherein when said operator manipulates said operation part to select a product lot measurement mode as said inspection mode, said means performing control is operative to transport substrates in a product lot taken out from said carrier and subjected to resist coating processing and prebaking to said inspection part, while carrying said substrates into an exposure apparatus after completion of film thickness measurement at said inspection part.

12. The method according to claim 4, wherein when a product lot measurement mode is selected as said inspection mode in said step a), substrates in a product lot taken out from said carrier are supplied in said step b), and said substrates in said product lot are carried into an exposure device in said step h) after said step e).

* * * * *